(12) United States Patent
Nanba et al.

(10) Patent No.: US 11,798,895 B2
(45) Date of Patent: Oct. 24, 2023

(54) QUANTUM DEVICE INCLUDING SHIELD PART AND METHOD OF MANUFACTURING THE SAME

(71) Applicant: NEC Corporation, Tokyo (JP)

(72) Inventors: Kenji Nanba, Tokyo (JP); Ayami Yamaguchi, Tokyo (JP); Akira Miyata, Tokyo (JP); Katsumi Kikuchi, Tokyo (JP); Suguru Watanabe, Tokyo (JP); Takanori Nishi, Tokyo (JP); Hideyuki Satou, Tokyo (JP)

(73) Assignee: NEC CORPORATION, Tokyo (JP)

( * ) Notice: Subject to any disclaimer, the term of this patent is extended or adjusted under 35 U.S.C. 154(b) by 62 days.

(21) Appl. No.: 17/357,233

(22) Filed: Jun. 24, 2021

(65) Prior Publication Data

US 2021/0407928 A1 Dec. 30, 2021

(30) Foreign Application Priority Data

Jun. 29, 2020 (JP) .................................. 2020-111954

(51) Int. Cl.
*H01L 23/552* (2006.01)
*G06N 10/40* (2022.01)
*H01L 23/498* (2006.01)

(52) U.S. Cl.
CPC ...... *H01L 23/552* (2013.01); *H01L 23/49888* (2013.01)

(58) Field of Classification Search
CPC ............. H01L 23/552; H01L 23/49888; H01L 39/223; H01L 24/10; H01L 39/045; H01L 39/2493; H01L 39/025; G06N 10/40
USPC .......................................................... 257/659
See application file for complete search history.

(56) References Cited

U.S. PATENT DOCUMENTS

2019/0042964 A1* 2/2019 Elsherbini ........... H01L 25/0652
2019/0044047 A1* 2/2019 Elsherbini ......... H01L 23/49888

FOREIGN PATENT DOCUMENTS

JP 2009-295625 A 12/2009

* cited by examiner

*Primary Examiner* — Didarul A Mazumder (57) ABSTRACT

A quantum device (100) includes an interposer (112), a quantum chip (111) mounted on the interposer (112), and a shield part (150) provided so as to surround a quantum circuit region of the interposer (112) and the quantum chip (111). Accordingly, the quantum device (100) is able to prevent interference in the quantum circuit region due to exogenous noise.

15 Claims, 12 Drawing Sheets

QUANTUM DEVICE INCLUDING SHIELD PART AND METHOD OF MANUFACTURING THE SAME

INCORPORATION BY REFERENCE

This application is based upon and claims the benefit of priority from Japanese patent application No. 2020-111954, filed on Jun. 29, 2020, the disclosure of which is incorporated herein in its entirety by reference.

TECHNICAL FIELD

The present disclosure relates to a quantum device and a method of manufacturing the same.

BACKGROUND ART

A quantum device formed of a superconducting material is mounted on a quantum computer device. This quantum device is placed in a cryogenic environment, whereby this quantum device is able to achieve operations that utilize superconducting phenomena. The cryogenic temperature indicates, for example, about 9 K when niobium (Nb) is used and about 1.2 K when aluminum (Al) is used.

A technique that relates to a quantum device is disclosed, for example, in Japanese Unexamined Patent Application Publication No. 2009-295625. In an electronic component (quantum device) disclosed in Japanese Unexamined Patent Application Publication No. 2009-295625, an insulating substrate is flip-chip connected to a device chip via a bump.

There is a problem, in the configuration disclosed in Japanese Unexamined Patent Application Publication No. 2009-295625, that exogenous noise such as electromagnetic waves enters between the device chip (quantum chip) and the insulating substrate (interposer), which affects an operation region (quantum circuit) and causes processing errors.

SUMMARY

An object of the present disclosure is to provide a quantum device and a method of manufacturing the same that solve the aforementioned problem.

According to one example embodiment, a quantum device includes: an interposer; a quantum chip mounted on the interposer; and a shield part provided so as to surround a quantum circuit region of the interposer and the quantum chip.

According to one example embodiment, a method of manufacturing a quantum device includes: providing a shield part so as to surround a quantum circuit region of an interposer and a quantum chip; and arranging a quantum chip on the interposer via the shield part.

BRIEF DESCRIPTION OF DRAWINGS

The above and other aspects, features and advantages of the present disclosure will become more apparent from the following description of certain exemplary embodiments when taken in conjunction with the accompanying drawings, in which.

EMBODIMENTS

Example embodiments of the present invention will be described below with reference to the accompanying drawings. Note that the drawings are in simplified form and the technical scope of the example embodiments should not be interpreted to be limited to the drawings. The same elements are denoted by the same reference numerals and a duplicate description is omitted.

In the following example embodiments, when necessary, the present invention is explained by using separate sections or separate example embodiments. However, those example embodiments are not unrelated with each other, unless otherwise specified. That is, they are related in such a manner that one example embodiment is a modified example, an application example, a detailed example, or a supplementary example of a part or the whole of another example embodiment. Further, in the following example embodiments, when the number of elements or the like (including numbers, values, quantities, ranges, and the like) is mentioned, the number is not limited to that specific number except for cases where the number is explicitly specified or the number is obviously limited to a specific number based on its principle. That is, a larger number or a smaller number than the specific number may also be used. For example, a plurality of quantum chips and a plurality of interposers may be formed.

Further, in the following example embodiments, the components (including operation steps and the like) are not necessarily indispensable except for cases where the component is explicitly specified or the component is obviously indispensable based on its principle. Similarly, in the following example embodiments, when a shape, a position relation, or the like of a component(s) or the like is mentioned, shapes or the like that are substantially similar to or resemble that shape are also included in that shape except for cases where it is explicitly specified or they are eliminated based on its principle. This is also true for the above-described number or the like (including numbers, values, quantities, ranges, and the like).

In the following, quantum computing refers to the field of utilizing quantum mechanical phenomena (quantum bits) to manipulate data. These quantum mechanical phenomena include superposition of a plurality of states (in which a quantum variable simultaneously exists in multiple different states) and entanglement (a state in which multiple quantum variables have related states irrespective of space or time). A quantum circuit that generates quantum bits is provided in a quantum chip.

<Study in Advance by Inventors>

Prior to giving the description of a quantum device 100 according to a first example embodiment, contents studied in advance by the inventors will be described.

Figure 12:
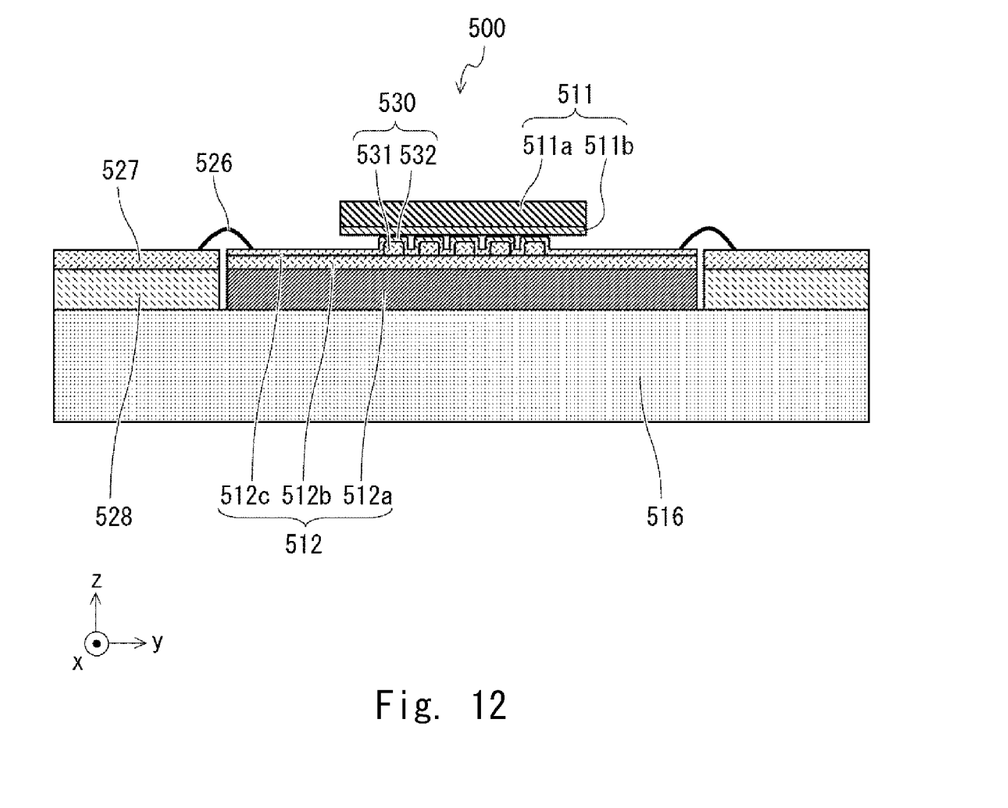
FIG. 12 is a schematic cross-sectional view of a quantum device in a conceptual stage.

FIG. 12 is a schematic cross-sectional view of a quantum device 500 in a conceptual stage before reaching the first example embodiment. The quantum device 500 is mounted on a quantum computer device and placed in a cryogenic environment, whereby operations that utilize superconductive phenomena are achieved.

Specifically, the quantum device 500 includes a quantum chip 511, an interposer 512, a connection part 530, a sample table 516, a base substrate 528, and a bonding wire 526.

The interposer 512 and the base substrate 528 are arranged in proximity to each other on the main surface of the sample table 516. The sample table 516 includes a cooling function.

The interposer 512 includes an interposer substrate 512a, a wiring layer 512b, and a metal film 512c. The wiring layer 512b is formed on one main surface (the surface that is opposite to the surface that contacts the sample table 516) of the interposer substrate 512a (hereinafter it may also be simply referred to as an interposer 512), and the metal film 512c is further formed on the surface of the wiring layer 512b as a part of the wiring layer 512b.

The wiring layer 512b is formed of one of a superconducting material and a normal conducting material. The superconducting material is, for example, a metallic material such as niobium (Nb), niobium nitride (NbN), aluminum (Al), indium (In), lead (Pb), tin (Sn), rhenium (Re), palladium (Pd), titanium (Ti), titanium nitride (TiN), tantalum (Ta), and an alloy including any of them. The normal conducting material is, for example, a metallic material such as copper (Cu), silver (Ag), gold (Au), platinum (Pt), and an alloy including any of them. In this example, a case in which the wiring layer 512b is made of Cu, which is a normal conducting material, will be described.

Further, the metal film 512c is formed of a superconducting material. The superconducting material is, for example, a metallic material such as niobium (Nb), niobium nitride (NbN), aluminum (Al), indium (In), lead (Pb), tin (Sn), rhenium (Re), palladium (Pd), titanium (Ti), titanium nitride (TiN), tantalum (Ta), and an alloy including any of them. In this example, a case in which the metal film 512c is made of Nb will be described.

The quantum chip 511 includes a quantum chip body 511a and a wiring layer 511b. The wiring layer 511b is formed on one main surface of the quantum chip body 511a (hereinafter it may also be simply referred to as a quantum chip 511). The wiring layer 511b of the quantum chip 511 is formed of a superconducting material. In this example, a case in which the wiring layer 511b is made of Nb will be described.

The quantum chip 511 and the interposer 512 are arranged in such a way that the wiring layers 511b and 512b thereof are opposed to each other.

The connection part 530 is provided between the quantum chip 511 and the interposer 512 and electrically connects the wiring layer 511b of the quantum chip 511 to the wiring layer 512b of the interposer 512. Accordingly, signal can be transferred between the quantum chip 511 and the interposer 512. Non-contact signal transfer may also be performed between the quantum chip 511 and the interposer 512.

Specifically, the connection part 530 includes a plurality of pillars 531 and a metal film 532. The plurality of pillars 531 are formed so as to be protruded from one main surface of the interposer 512. The metal film 532 is formed on the surface of the plurality of pillars 531. The metal film 532 is formed on the surface of the plurality of pillars 531 so as to be continuous with the metal film 512c formed on the surface of the wiring layer 512b of the interposer 512.

Note that the plurality of pillars 531 are made of one of a superconducting material and a normal conducting material. In this example, a case in which the plurality of pillars 531 are made of Cu, which is a normal conducting material, will be described. Further, the metal film 532 is formed of a superconducting material, just like the metal film 512c. In this example, a case in which the metal film 532 is made of Nb will be described.

The wiring layer 512b of the interposer 512 (including the metal film 512c) and a wiring layer 527 of the base substrate 528 are connected to each other via the bonding wire 526. Accordingly, signal lines (terminals) of the quantum chip 511 are externally drawn out via the interposer 512 and the bonding wire 526.

Further, heat in the quantum chip 511 is dissipated to the sample table 516 having a cooling function via the interposer 512. Accordingly, the quantum device 500 is maintained in a cryogenic state where superconducting phenomena can be utilized.

Referring to FIG. 12, in the quantum device 500, exogenous noise such as electromagnetic waves enters between the quantum chip 511 and the interposer 512, which affects the quantum circuit and causes processing errors.

In order to solve the above problem, a quantum device 100 according to a first example embodiment capable of improving the quality of quantum coherence by preventing interference in the quantum circuit due to exogenous noise has been made.

First Example Embodiment

Figure 1:
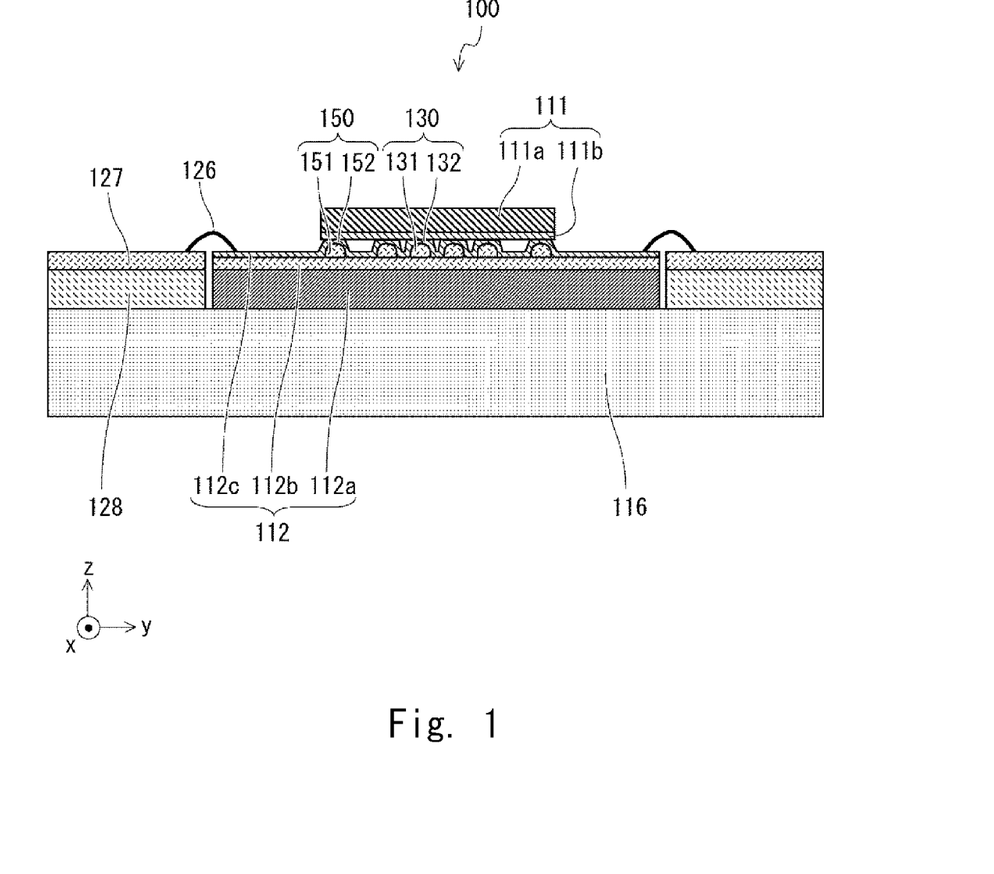
FIG. 1 is a schematic cross-sectional view of a quantum device according to a first example embodiment.
Figure 2:
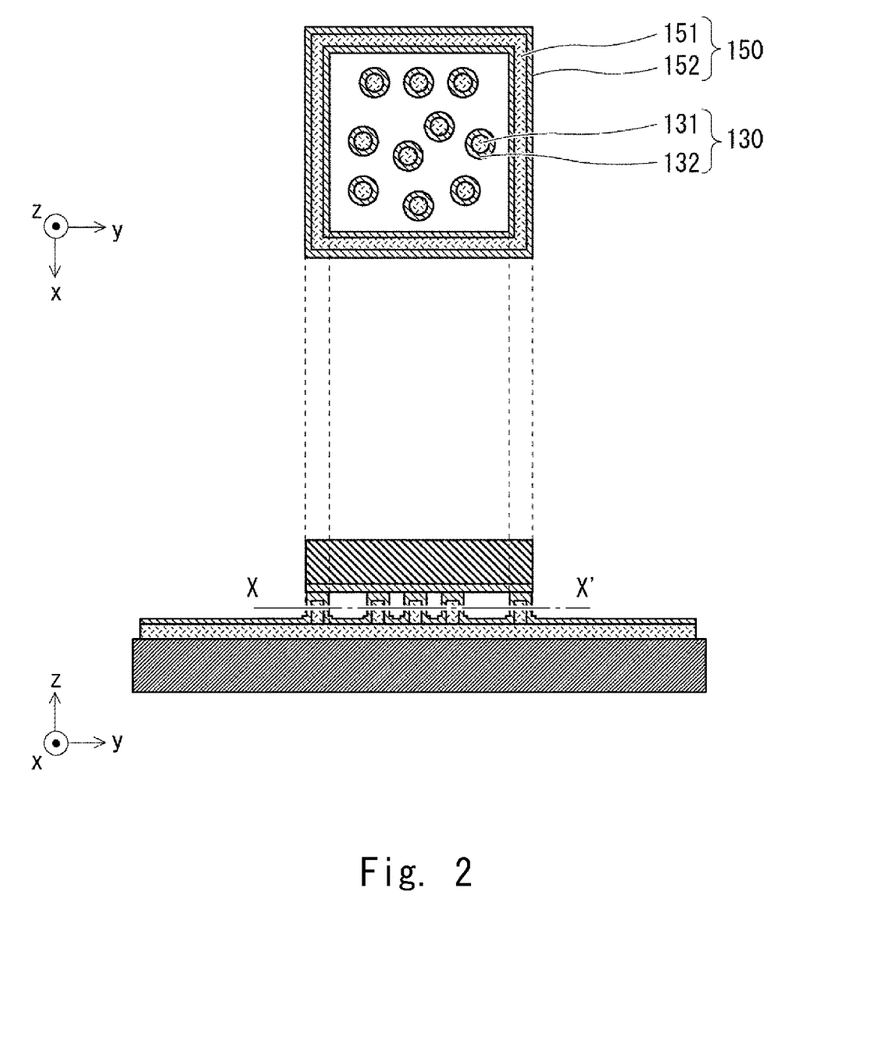
FIG. 2 is a schematic plan view of the quantum device shown in FIG. 1.

FIG. 1 is a schematic cross-sectional view of a quantum device 100 according to a first example embodiment. Further, FIG. 2 is a schematic plan view of the quantum device 100 taken along the part of the line X-X' of the schematic cross-sectional view of the quantum device 100. The quantum device 100 is mounted on a quantum computer device and is placed in a cryogenic environment, whereby operations that utilize superconductive phenomena are achieved.

Specifically, the quantum device 100 includes a quantum chip 111, an interposer 112, a connection part 130, a shield part 150, a sample table 116, a base substrate 128, and a bonding wire 126.

The interposer 112 and the base substrate 128 are arranged in proximity to each other on the main surface of the sample table 116. The sample table 116 includes a cooling function. Specifically, the sample table 116 is preferably made of copper (Cu), an alloy including copper, or aluminum (Al) in view of heat conduction. When the sample table 116 is made of aluminum, it may be insulated by alumite treatment.

The interposer 112 includes an interposer substrate 112a, a wiring layer 112b, and a metal film 112c. The wiring layer 112b is formed on one main surface (the surface that is opposite to the surface that contacts the sample table 116) of the interposer substrate 112a (hereinafter it may also be simply referred to as an interposer 112) and the metal film 112c is further formed on the surface of the wiring layer 112b as a part of the wiring layer 112b. The interposer 112 includes, for example, silicon (Si). The interposer 112 is not limited to the one that includes silicon as long as the quantum chip 111 can be mounted thereon, and the interposer 112 may include another electronic material such as sapphire, a compound semiconductor material (group IV, group III-V, group II-VI), glass, or ceramic. A surface of the interposer substrate 112a is preferably covered with a silicon oxide film (SiO2, TEOS film or the like).

The wiring layer 112b is formed of one of a superconducting material and a normal conducting material. The superconducting material is, for example, a metallic material such as niobium (Nb), niobium nitride (NbN), aluminum (Al), indium (In), lead (Pb), tin (Sn), rhenium (Re), palladium (Pd), titanium (Ti), titanium nitride (TiN), tantalum (Ta), and an alloy including any of them. The normal conducting material is, for example, a metallic material such as copper (Cu), silver (Ag), gold (Au), platinum (Pt), and an alloy including any of them. In this example, a case in which the wiring layer 112b is made of Cu, which is a normal conducting material, will be described.

Further, the metal film 112c is formed of a superconducting material. The superconducting material is, for example, a metallic material such as niobium (Nb), niobium nitride (NbN), aluminum (Al), indium (In), lead (Pb), tin (Sn), rhenium (Re), palladium (Pd), titanium (Ti), titanium nitride (TiN), tantalum (Ta), and an alloy including any of them. In this example, a case in which the metal film 112c is made of Nb will be described.

The quantum chip 111 includes a quantum chip body 111a and a wiring layer 111b. The wiring layer 111b is formed on one main surface of the quantum chip body 111a (hereinafter it may also be simply referred to as a quantum chip 111). The quantum chip 111 includes, for example, silicon (Si). The quantum chip 111 is not limited to the one that includes silicon as long as this quantum chip 111 is able to form quantum bits, and may include another electronic material such as sapphire or a compound semiconductor material (group IV, group III-V, group II-VI). Further, while the quantum chip 111 is preferably a monocrystal quantum chip, it may instead be a polycrystal or amorphous quantum chip. Further, the wiring layer 111b of the quantum chip 111 is formed of a superconducting material. In this example, a case in which the wiring layer 111b is made of Nb will be described.

The quantum chip 111 and the interposer 112 are arranged in such a way that the wiring layers 111b and 112b thereof are opposed to each other.

The connection part 130 is provided between the quantum chip 111 and the interposer 112 and electrically connects the wiring layer 111b of the quantum chip 111 to the wiring layer 112b of the interposer 112. Accordingly, signals can be transferred between the quantum chip 111 and the interposer 112. Non-contact signal transfer may also be performed between the quantum chip 111 and the interposer 112.

Specifically, the connection part 130 includes a plurality of pillars 131 and a metal film 132. The plurality of pillars 131 are formed in such a way that they are protruded from one main surface of the interposer 112. The metal film 132 is formed on a surface of the plurality of pillars 131. The metal film 132 is formed on the surface of the plurality of pillars 131 in such a way that the metal film 132 is continuous with the metal film 112c formed on the surface of the wiring layer 112b of the interposer 112.

Note that the plurality of pillars 131 are formed of one of a superconducting material and a normal conducting material. In order to enhance the cooling performance, for example, they are preferably formed of a normal conducting material. In this example, a case in which the plurality of pillars 131 are made of Cu, which is a normal conducting material, will be described. Further, the metal film 132 is made of a superconducting material, just like the metal film 112c. That is, in this example, a case in which the metal film 132 is made of Nb will be described.

The wiring layer 112b of the interposer 112 (including the metal film 112c) and a wiring layer 127 of the base substrate 128 are connected to each other by the bonding wire 126. Accordingly, signal lines (terminals) of the quantum chip 111 are externally drawn out via the interposer 112 and the bonding wire 126.

Further, heat in the quantum chip 111 is dissipated to the sample table 116 that has a cooling function via the interposer 112. Accordingly, the quantum device 100 is maintained in a cryogenic state where superconducting phenomena can be utilized.

The shield part 150 is formed to surround a quantum circuit region (including the connection part 130) of each of the interposer 112 and the quantum chip 111. Further, the shield part 150 is formed of a metallic material connected to the ground. Accordingly, the shield part 150 is able to prevent interference in the quantum circuit due to exogenous noise. As a result, processing errors in the quantum circuit can be prevented and the quality of the quantum device 100 (quantum coherence etc.) can be improved.

In this example, the shield part 150 is formed so as to surround the quantum circuit region (including the connection part 130) between the interposer 112 and the quantum chip 111 by four prismatic members (side parts; also referred to as connecting parts that connect together corner parts) arranged along the outer periphery of the quantum chip 111. Further, in this example, the shield part 150 is formed of a metallic material the same as that of the connection part 130. Specifically, the shield part 150 includes a projection part 151 and a metal film 152 formed on the surface of the projection part 151. The projection part 151 is formed of one of a superconducting material and a normal conducting material and the metal film 152 is formed of a superconducting material. In this example, like the pillars 131 of the connection part 130, the projection part 151 is made of Cu, and, like the metal film 132 of the connection part 130, the metal film 152 is made of Nb.

Next, a method of manufacturing the quantum device 100 will be partly described. First, the wiring layer 112b is formed on one main surface of the interposer 112 and then the plurality of pillars 131 are formed so as to be protruded from one main surface of the interposer 112. After that, along with the timing when the metal film 112c is formed on the surface of the wiring layer 112b, the metal film 132 is formed on the surface of the plurality of pillars 131. The connection part 130 is thus formed. Further, at this time, the shield part 150 is formed so as to surround the quantum circuit region including the connection part 130. Specifically, first, the projection part 151 is formed so as to surround the plurality of pillars 131 and then the metal film 152 is formed on the surface of the projection part 151. The shield part 150 is thus formed. Note that the metal films 132 and 152 are formed so as to be continuous with the metal film 112c formed on the surface of the wiring layer 112b. After that, the quantum chip 111 is arranged on one main surface of the interposer 112 in such a way that the wiring layer 111b of the quantum chip 111 contacts the connection part 130. The quantum device 100 is thus formed through the above process.

As described above, in the quantum device 100 according to this example embodiment, the shield part 150 is formed so as to surround the quantum circuit region (including the connection part 130) of the interposer 112 and the quantum chip 111. Accordingly, the quantum device 100 is able to prevent interference in the quantum circuit due to exogenous noise. As a result, processing errors in the quantum circuit can be prevented and the quantum device 100 is able to improve the quality (quantum coherence etc.)

While the case in which the wiring layer 112b of the interposer 112 is made of a normal conducting material and the metal film 112c formed on its surface is made of a superconducting material has been described in this example embodiment, this is merely one example. The wiring layer 112b of the interposer 112 may be made of a superconducting material such as Nb. In this case, the metal film 112c may not be formed on the surface of the wiring layer 112b. Further, in this case, for example, the wiring layer 112b of the interposer 112, the metal film 132 formed in the connection part 130, and the metal film 152 formed in the shield part 150 are formed in such a way that they are continuous with one another (integrally formed).

Figure 3:
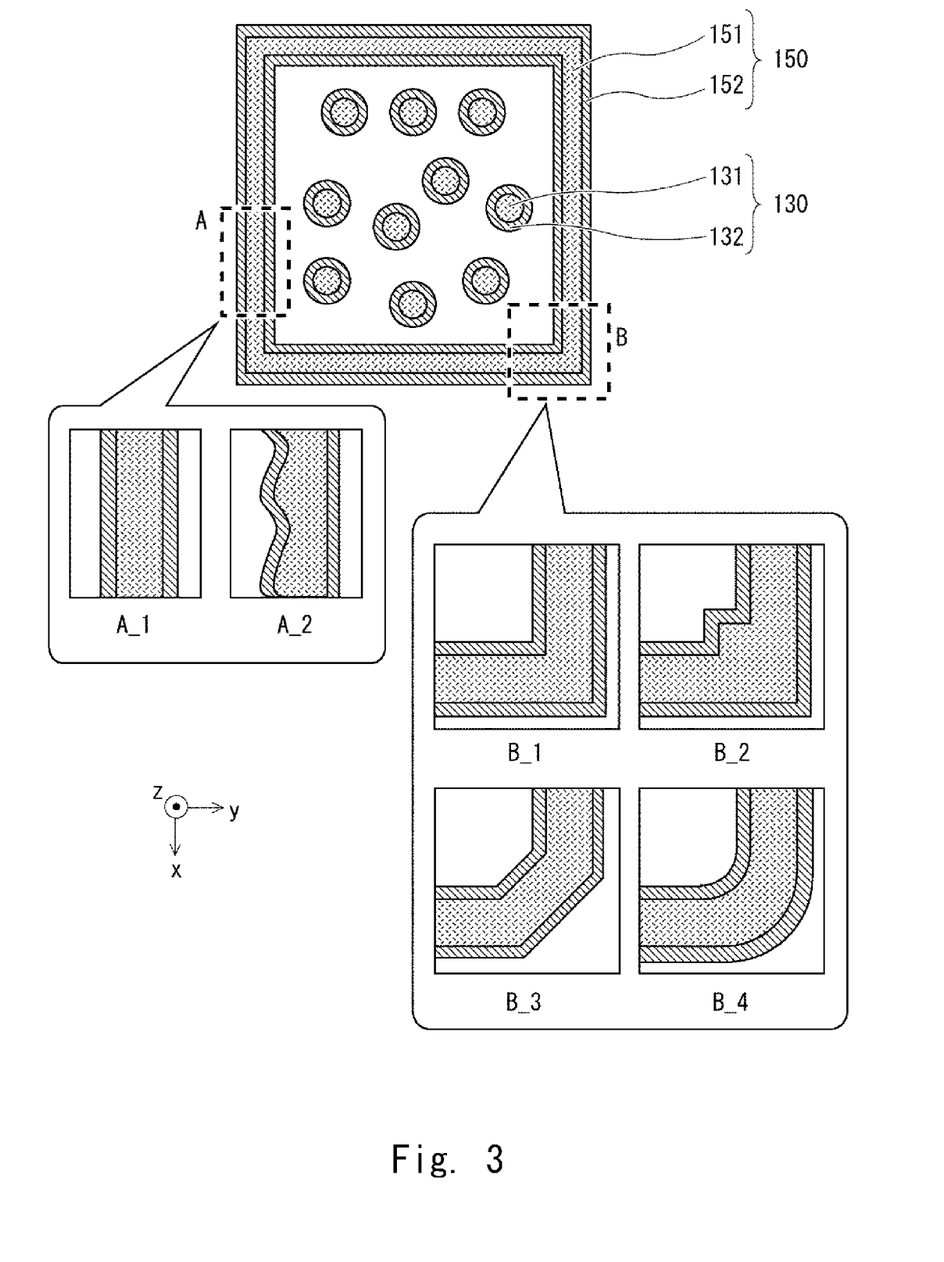
FIG. 3 is a schematic plan view showing some modified examples of a shield part.

Further, the outer periphery of four prism members (side parts) that form the shield part 150 may be a straight shape as shown in a first example A_1 of an area A shown in FIG. 3 or may be a wave shape as shown in a second example A_2 of the area A shown in FIG. 3. Further, four corner parts formed at the intersections of the four prism members (side parts) that form the shield part 150 may have a simple square shape as shown in a first example B_1 of an area B shown in FIG. 3 or special treatment may be performed as described below. For example, each corner part may be formed to have a width larger than those of parts other than the corner parts (i.e., side parts) as shown in a second example B_2 of the area B shown in FIG. 3, may be chamfered as shown in a third example B_3, or may have a round shape as shown in a fourth example B_4.

Further, when a space region surrounded by the shield part 150, the quantum chip 111, and the interposer 112 is sealed, this space region may be set in a vacuum state so that the heat insulation property between the interposer 112 and the quantum chip 111 can be improved.

Figure 4:
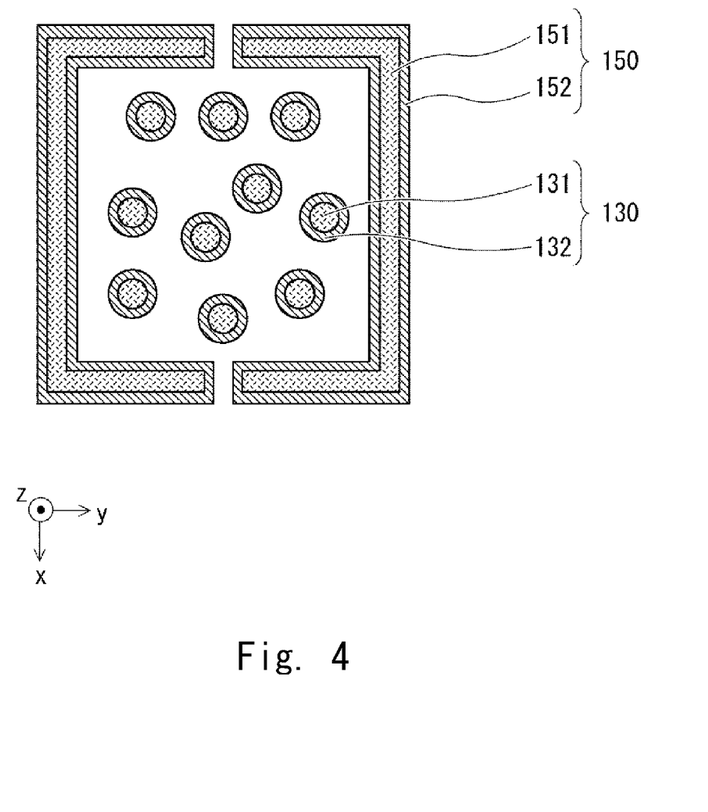
FIG. 4 is a schematic plan view showing another modified example of the shield part.
Figure 5:
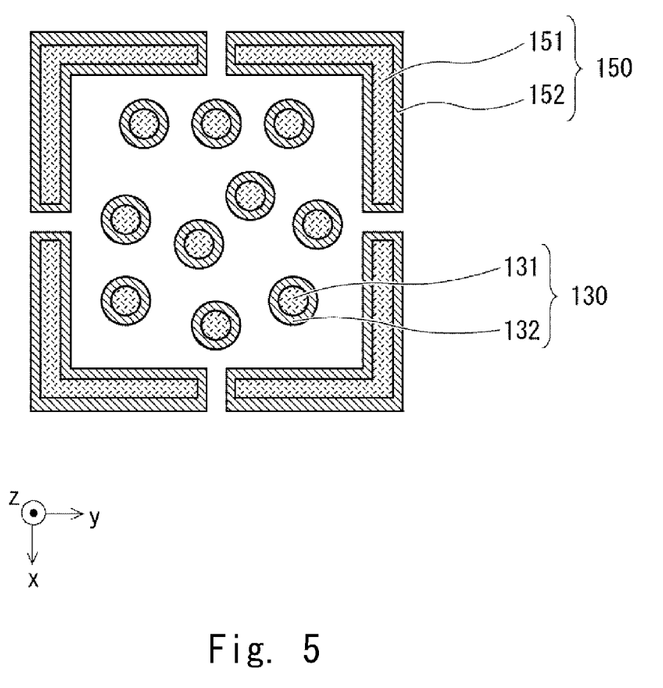
FIG. 5 is a schematic plan view showing another modified example of the shield part.

However, even when the above space region is not sealed, the influence on the quantum circuit region by exogenous noise may still be reduced. For example, as shown in FIG. 4, gaps may be provided at the center of two opposed side parts among the four side parts of the shield part 150. Alternatively, as shown in FIG. 5, gaps may be provided at the respective center parts of the four side parts of the shield part 150. The gaps may be formed in parts other than the center of the side parts.

Figure 6:
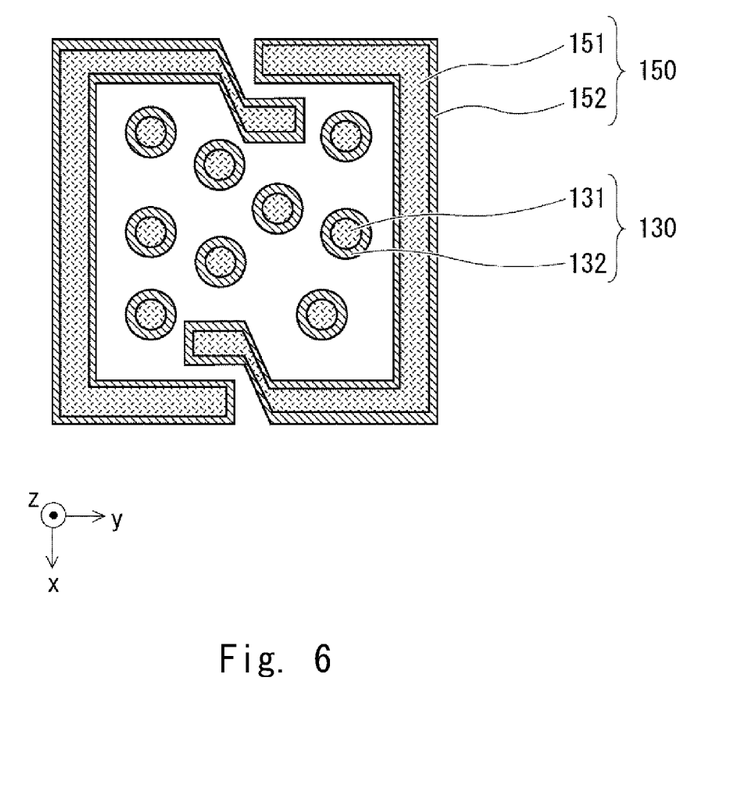
FIG. 6 is a schematic plan view showing another modified example of the shield part.
Figure 7:
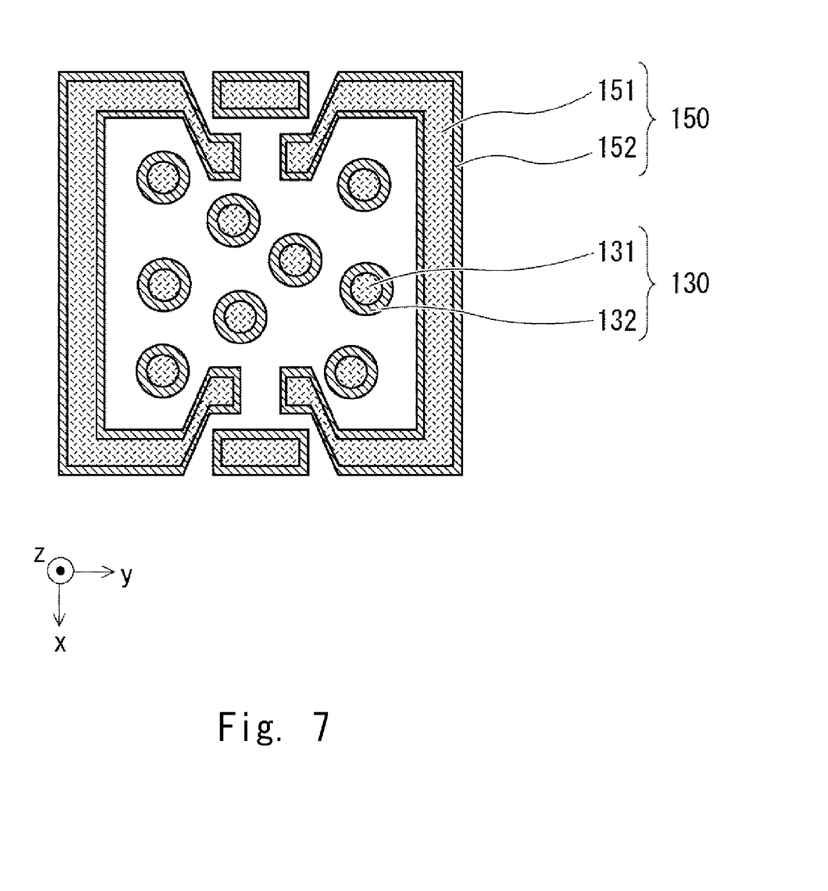
FIG. 7 is a schematic plan view showing another modified example of the shield part.

Alternatively, as shown in FIGS. 6 and 7, the gap parts of the shield part 150 may be formed in such a way that the inside the region surrounded by the shield part 150 cannot be directly viewed from the outside thereof. Specifically, as shown in FIG. 6, one end part of the shield part in each gap part may be formed to be extended so as to enter the region surrounded by the shield part. Alternatively, as shown in FIG. 7, both end parts of the shield part in each gap part may be formed to enter the region surrounded by the shield part and a shielding part (a part of the shield part) may be further formed so as to shield the gap part. Accordingly, it is possible to efficiently reduce interference in the quantum circuit due to exogenous noise.

Second Example Embodiment

Figure 8:
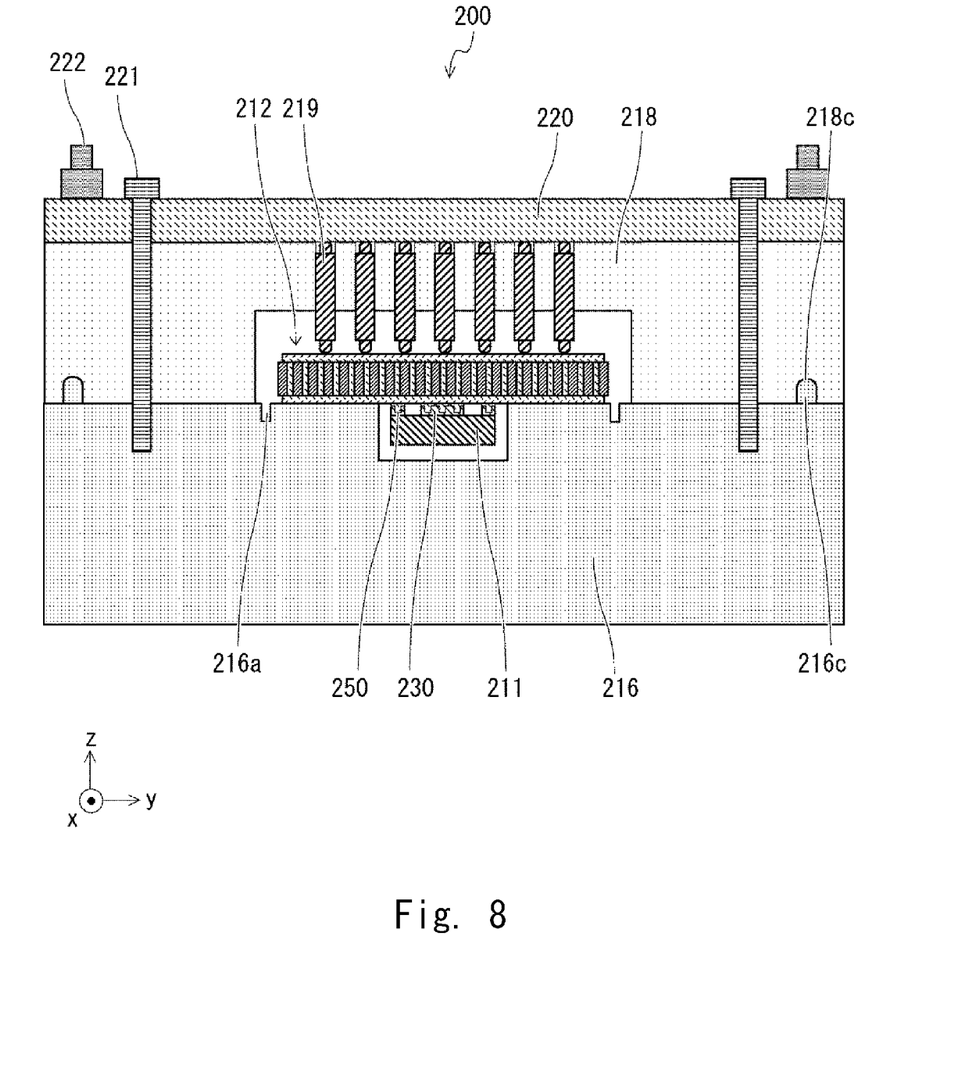
FIG. 8 is a schematic cross-sectional view of a quantum device according to a second example embodiment.
Figure 9:
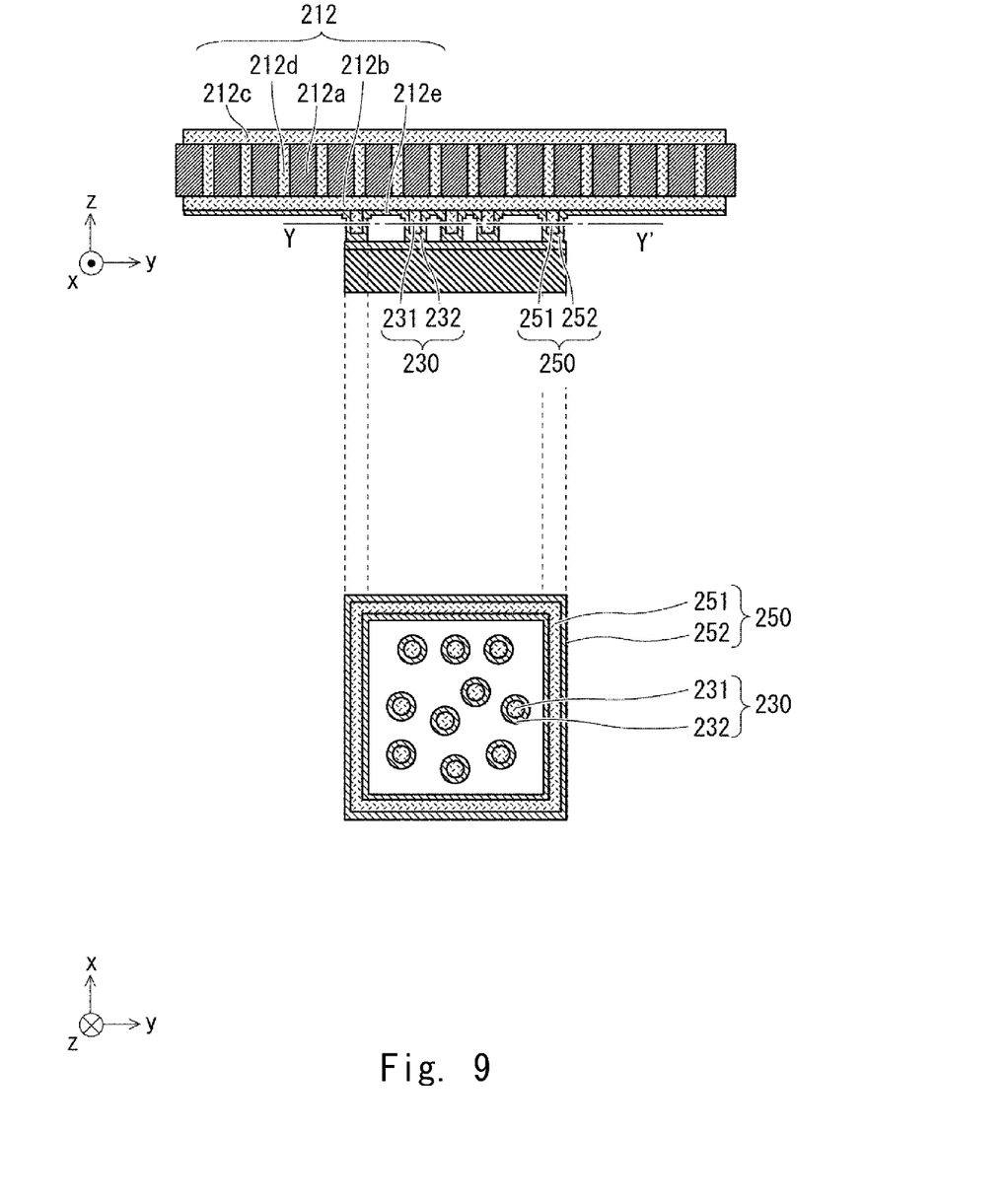
FIG. 9 is a schematic plan view of the quantum device shown in FIG. 8.

FIG. 8 is a schematic cross-sectional view of a quantum device 200 according to a second example embodiment. Further, FIG. 9 is a schematic plan view of the quantum device 200 taken along the line Y-Y' of a schematic cross-sectional view of the quantum device 200. The quantum device 200 includes a device structure different from that of the quantum device 100.

Specifically, the quantum device 200 includes a quantum chip 211, an interposer 212, a connection part 230, a shield part 250, a sample table 216, a probe head 218, probe pins 219, a probe card 220, fixing screws 221, and plugs 222.

The sample table 216 includes a recessed part at the center of its main surface (upper surface) and the quantum chip 211 is arranged inside each recessed part with gaps therebetween. The quantum chip 211 may be formed in such a way that it can fit within the recessed part. Further, alignment holes 216a used when the quantum chip 211 is arranged inside the recessed part of the sample table 216 are provided on the main surface of the sample table 216. Accordingly, the quantum chip 211 can be accurately arranged inside the recessed part of the sample table 216. Further, alignment pins 216c that correspond to holes 218c provided in the probe head 218 are provided on the main surface of the sample table 216. Accordingly, the probe head 218 can be accurately arranged in the sample table 216. Note that the sample table 216 is preferably made of copper (Cu), an alloy including copper, or aluminum (Al) in view of heat conduction. When the sample table 216 is made of aluminum, it may be insulated by alumite treatment.

The interposer 212 includes an interposer substrate 212a, a wiring layer 212b, a wiring layer 212c, and a Through Via (TV) 212d. The wiring layer 212b is formed on one main surface (the surface where the quantum chip 211 is provided) of the interposer substrate 212a (hereinafter it may also be simply referred to as an interposer 212) and a metal film 212e is further formed as a part of the wiring layer 212b on the surface of the wiring layer 212b. The wiring layer 212c is formed on the other main surface of the interposer substrate 212a. The wiring layers 212b and 212c are electrically connected to each other via the TV 212d formed inside the interposer substrate 212a. The interposer 212 includes, for example, silicon (Si). Note that the interposer 212 is not limited to the one that includes silicon as long as the quantum chip 211 can be mounted thereon and may include another electronic material such as sapphire, a compound semiconductor material (group IV, group III-V, group II-VI), glass, or ceramic. The surface of the interposer substrate 212a is preferably covered with a silicon oxide film (SiO2, TEOS film or the like). Further, when silicon is used, a Through Silicon Via (TSV) is used as the TV 212d.

The wiring layers 212b and 212c, and the TV 212d are each formed of one of a superconducting material and a normal conducting material. The superconducting material is, for example, a metallic material such as niobium (Nb), niobium nitride (NbN), aluminum (Al), indium (In), lead (Pb), tin (Sn), rhenium (Re), palladium (Pd), titanium (Ti), titanium nitride (TiN), tantalum (Ta), and an alloy including any of them. The normal conducting material is, for example, a metallic material such as copper (Cu), silver (Ag), gold (Au), platinum (Pt), and an alloy including any of them. In this example, a case in which the wiring layers 212b and 212c, and the TV 212d are all made of Cu, which is a normal conducting material, will be described.

Further, the metal film 212e is formed of a superconducting material. The superconducting material is, for example, a metallic material such as niobium (Nb), niobium nitride (NbN), aluminum (Al), indium (In), lead (Pb), tin (Sn), rhenium (Re), palladium (Pd), titanium (Ti), titanium nitride (TiN), tantalum (Ta), and an alloy including any of them. In this example, a case in which the metal film 212e is made of Nb will be described.

The quantum chip 211 includes a quantum chip body 211a (not shown) and a wiring layer 211b (not shown). The quantum chip body 211a corresponds to the quantum chip body 111a and the wiring layer 211b corresponds to the wiring layer 111b. The wiring layer 211b is formed on one main surface of the quantum chip body 211a (hereinafter it may also be simply referred to as a quantum chip 211). The quantum chip 211 includes, for example, silicon (Si). The quantum chip 211 is not limited to the one that includes silicon as long as the quantum chip 211 is able to form quantum bits, and may include another electronic material such as sapphire or a compound semiconductor material (group IV, group III-V, group II-VI). Further, while the quantum chip 211 is preferably a monocrystal quantum chip, it may instead be a polycrystal or amorphous quantum chip. Further, the wiring layer 211b of the quantum chip 211 is formed of a superconducting material. In this example, a case in which the wiring layer 211b is made of Nb will be described.

The quantum chip 211 and the interposer 212 are arranged in such a way that the wiring layers 211b and 212b thereof are opposed to each other.

The connection part 230 is provided between the quantum chip 211 and the interposer 212 and electrically connects the wiring layer 211b of the quantum chip 211 to the wiring layer 212b of the interposer 212. Accordingly, signals can be transferred between the quantum chip 211 and the interposer 212. Non-contact signal transfer may also be performed between the quantum chip 211 and the interposer 212.

Specifically, the connection part 230 includes a plurality of pillars 231 and a metal film 232. The plurality of pillars 231 are formed (arranged) in such a way that they are protruded from one main surface of the interposer 212 (the surface where the quantum chip 211 is provided) to an area where the quantum chip 211 is mounted. The metal film 232 is formed (arranged) on the surface of the plurality of pillars 231 in such a way that the metal film 232 is continuous with the metal film 212e formed on the surface of the wiring layer 212b of the interposer 212.

The plurality of pillars 231 are formed of one of a superconducting material and a normal conducting material. In order to enhance the cooling performance, for example, they are preferably formed of a normal conducting material. In this example, a case in which the plurality of pillars 231 are made of Cu, which is a normal conducting material, will be described. Further, the metal film 232 is made of a superconducting material, just like the metal film 212e. That is, in this example, a case in which the metal film 232 is made of Nb will be described.

The probe head 218 is arranged on the sample table 216 and the probe card 220 is further arranged on the probe head 218. The holes 218c are provided in the probe head 218 and the alignment pins 216c that correspond to the holes 218c are provided in the sample table 216. Accordingly, the probe head 218 can be accurately arranged in the sample table 216. Further, they are fixed to the sample table 216 by the fixing screws 221. Therefore, desired positions of the wiring layer 212c of the interposer 212 can be accurately touched with the probe pins 219. Further, the plugs 222 are arranged on the probe card 220.

The probe head 218 has a recessed part on its bottom surface and the interposer 212 is arranged in the recessed part thereof. That is, the quantum chip 211 and the interposer 212 are arranged in a space region formed of the recessed part of the probe head 218 and the recessed part of the sample table 216. This space region is preferably in a vacuum state. Accordingly, the heat insulation property is improved, whereby heat transfer from the interposer 212 to the quantum chip 211 can be, for example, prevented.

The plurality of probe pins 219 are provided between the interposer 212 and the probe card 220 and electrically connect the wiring layer 212c formed on the other surface of the interposer 212 (the surface that is opposite to the surface where the quantum chip 211 is provided) to the probe card 220. Accordingly, signal lines (terminals) of the quantum chip 211 are externally drawn out via the interposer 212, the probe pins 219, the probe card 220, and the plugs 222.

Further, heat in the quantum chip 211 is dissipated to the sample table 216 having a cooling function via the interposer 212. Accordingly, the quantum device 200 is maintained in a cryogenic state where superconducting phenomena can be utilized.

The shield part 250 is formed so as to surround a quantum circuit region (including the connection part 230) of the interposer 212 and the quantum chip 211. Further, the shield part 250 is formed of a metallic material connected to the ground. Accordingly, the shield part 250 is able to prevent interference in the quantum circuit due to exogenous noise. As a result, processing errors in the quantum circuit can be prevented and the quantum device 200 is able to improve the quality (quantum coherence etc.) Since the shield part 250 is basically similar to the shield part 150 provided in the quantum device 100, detailed descriptions thereof will be omitted.

Next, a method of manufacturing the quantum device 200 will be partly manufactured. First, the wiring layer 212b is formed on one main surface of the interposer 212 and then the plurality of pillars 231 are formed so as to be protruded from one main surface of the interposer 112. After that, along with the timing when the metal film 212e is formed on the surface of the wiring layer 212b, the metal film 232 is formed on the surface of the plurality of pillars 231. The connection part 230 is thus formed. Further, at this time, the shield part 250 is formed so as to surround the quantum circuit region including the connection part 230. Specifically, first, the projection part 251 is formed so as to surround the plurality of pillars 231 and then the metal film 252 is formed on the surface of the projection part 251. The shield part 250 is thus formed. Note that the metal films 232 and 252 are formed so as to be continuous with the metal film 212e formed on the surface of the wiring layer 212b. After that, the quantum chip 211 is arranged on one main surface of the interposer 212 in such a way that the wiring layer 211b of the quantum chip 211 contacts the connection part 230. The quantum device 200 is thus formed through the above process.

As described above, in the quantum device 200 according to this example embodiment, the shield part 250 is formed so as to surround the quantum circuit region (including the connection part 230) of the interposer 212 and the quantum chip 211. Accordingly, the quantum device 200 is able to prevent interference in the quantum circuit due to exogenous noise. As a result, processing errors in the quantum circuit can be prevented and the quantum device 200 is able to improve the quality (quantum coherence etc.)

While the case in which the wiring layer 212b of the interposer 212 is made of a normal conducting material and the metal film 212e formed on its surface is made of a superconducting material has been described in this example embodiment, this is merely one example. The wiring layer 212b of the interposer 212 may be formed of a superconducting material such as Nb. In this case, the metal film 212e may not be formed on the surface of the wiring layer 212b. Further, in this case, for example, the wiring layer 212b of the interposer 212, the metal film 232 formed in the connection part 230, and the metal film 252 formed in the shield part 250 are formed (integrally formed) so as to be continuous with each other.

First Modified Example of Quantum Device 200

Figure 10:
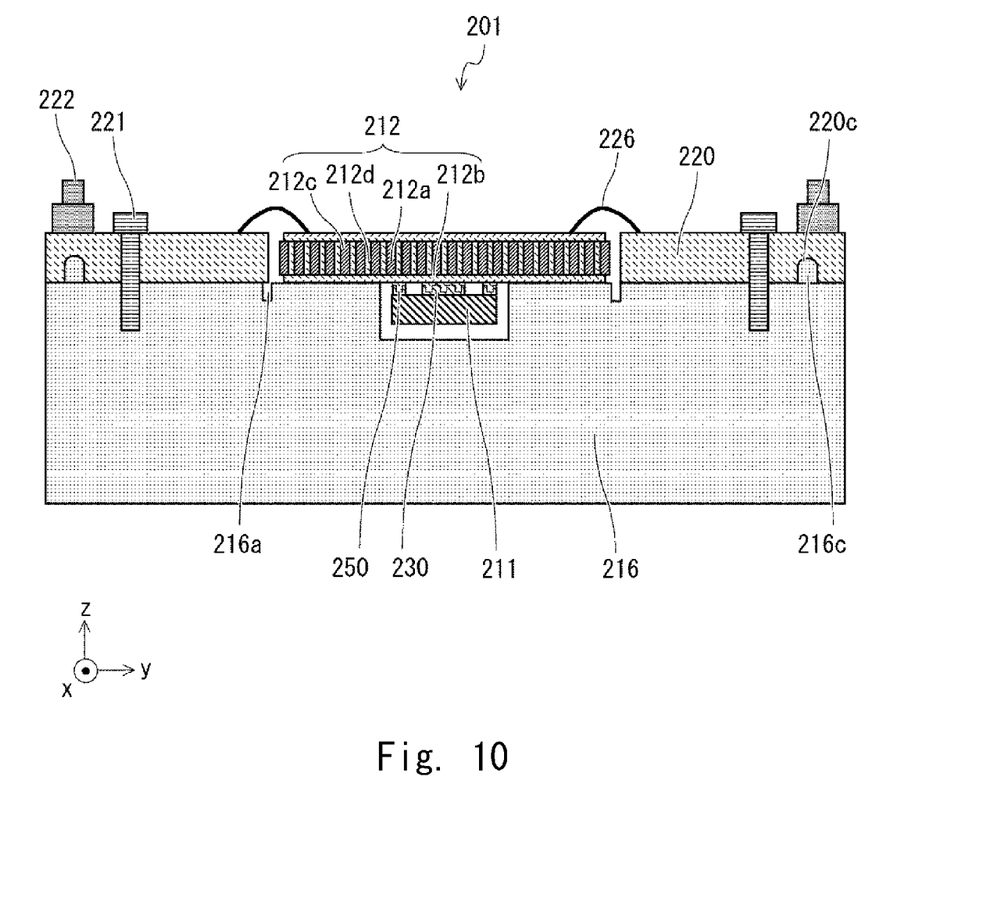
FIG. 10 is a schematic cross-sectional view of a first modified example of the quantum device shown in FIG. 8.

FIG. 10 is a schematic cross-sectional view showing a first modified example of the quantum device 200 as a quantum device 201. The quantum device 201 is different from the quantum device 200 in that the quantum device 201 includes a bonding wire 226 in place of the probe head 218 and the probe pins 219.

Specifically, as shown in FIG. 10, the probe card 220 is directly arranged on the sample table 216. The probe card 220 is fixed to the sample table 216 by the fixing screws 221. A terminal formed on the probe card 220 and a terminal formed on the other main surface of the interposer 212 (the surface that is opposite to the surface where the quantum chip 211 is provided) are connected to each other by the bonding wire 226. Accordingly, signal lines (terminals) of the quantum chip 211 are externally drawn out via the interposer 212, the bonding wire 226, the probe card 220, and the plugs 222.

Note that the alignment pins 216c that correspond to the holes 220c provided on the bottom surface of the probe card 220 are provided on the main surface of the sample table 216. Accordingly, the probe card 220 can be correctly arranged in the sample table 216. Since the other structures of the quantum device 201 are similar to those of the quantum device 200, descriptions thereof will be omitted.

The quantum device 201 is able to achieve the effects substantially the same as those of the quantum device 200.

Second Modified Example of Quantum Device 200

Figure 11:
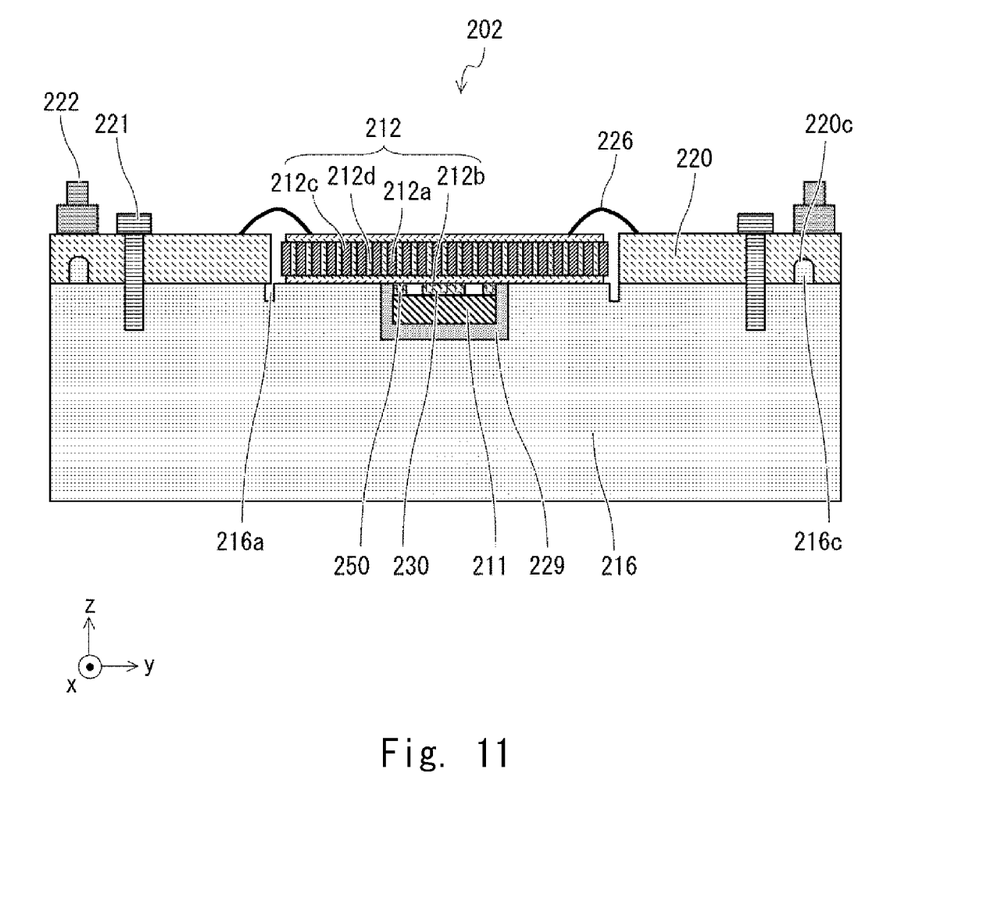
FIG. 11 is a schematic cross-sectional view of a second modified example of the quantum device shown in FIG. 8.

FIG. 11 is a schematic cross-sectional view showing a second modified example of the quantum device 200 as a quantum device 202. The quantum device 202 is different from the quantum device 201 in that the quantum device 202 further includes an adhesive 229 such as varnish or grease.

The adhesive 229 is provided in a space region surrounded by the recessed part of the sample table 216, the interposer 212, the quantum chip 211, and the shield part 250. The sample table 216, the interposer 212, and the quantum chip 211 are thereby fixed. Further, since heat in the quantum chip 211 is dissipated to the sample table 216 via the adhesive 229, heat dissipation is further improved.

At this time, the space region surrounded by the quantum chip 211, the interposer 212, and the shield part 250 (that is, the space region including the quantum circuit region) is preferably sealed. It is therefore possible to prevent the adhesive 229 from entering the quantum circuit region. Further, this space region (i.e., the space region including the quantum circuit region) is preferably in a vacuum state. Accordingly, the heat insulation property is improved, whereby heat transfer from the interposer 212 to the quantum chip 211 can be, for example, prevented.

While the example embodiments of the present disclosure have been described in detail with reference to the drawings, the specific configurations are not limited to the aforementioned ones and various design changes may be made without departing from the spirit of the present disclosure.

While the case in which the wiring layer of the quantum chip is made of Nb and the metal films of the shield part and the connection part include a single-layer structure made of Nb has been described in the aforementioned first and second embodiments, this is merely one example. It is sufficient that the metal films of the shield part and the connection part have a single-layer structure or a multi-layer structure and at least one layer be formed of a superconducting material.

Specifically, for example, the wiring layer of the quantum chip may be made of Nb, the metal films of the shield part and the connection part may have a two-layer structure, the bottom layer may be made of Nb, and the top layer may be made of In. A Ti layer or a TiN layer may be further provided between the Nb layer and the In layer in order to improve adhesiveness. The same is applied also to the metal film formed on the surface of the wiring layer of the interposer.

Alternatively, the wiring layer of the quantum chip may be made of Al and a layer made of Ti or TiN may be further provided in parts where the shield part and the connection part are arranged. Further, the metal films of the shield part and the connection part may have a three-layer structure, which may be made of Al, Ti (or TiN), In, or an alloy including the same in order from the bottom layer to the top layer. Note that Sn, Pb, or an alloy including any of them may be used in place of In or an alloy including the same. The Ti layer or the TiN layer is provided so as to prevent alloying of Al and In. The same is applied also to the metal film formed on the surface of the wiring layer of the interposer.

Alternatively, the wiring layer of the quantum chip may be made of Ta, the metal films of the shield part and the connection part may include a two-layer structure, the bottom layer may be made of Ta, and the top layer may be made of In, Sn, Pb, or an alloy including any of them. The same is applied also to the metal film formed on the surface of the wiring layer of the interposer.

According to the example embodiment, it is possible to provide a quantum device and a method of manufacturing the same capable of improving the quality such as quantum coherence by preventing interference in the quantum circuit due to exogenous noise.

The first and second embodiments can be combined as desirable by one of ordinary skill in the art.

While the disclosure has been particularly shown and described with reference to embodiments thereof, the disclosure is not limited to these embodiments. It will be understood by those of ordinary skill in the art that various changes in form and details may be made therein without departing from the spirit and scope of the present disclosure as defined by the claims.

The whole or part of the exemplary embodiments disclosed above can be described as, but not limited to, the following supplementary notes.

(Supplementary Note 1)

A quantum device comprising:

an interposer;

a quantum chip mounted on the interposer; and a shield part provided so as to surround a quantum circuit region of the interposer and the quantum chip.

(Supplementary Note 2)

The quantum device according to Supplementary Note 1, further comprising a connection part that is provided in the quantum circuit region and electrically connects the interposer to the quantum chip.

(Supplementary Note 3)

The quantum device according to Supplementary Note 2, wherein the shield part and the connection part are at least partly formed of a superconducting material.

(Supplementary Note 4)

The quantum device according to any one of Supplementary Notes 1 to 3, wherein the shield part is connected to the ground.

(Supplementary Note 5)

The quantum device according to any one of Supplementary Notes 1 to 4, wherein the shield part is provided along an outer periphery of the quantum chip.

(Supplementary Note 6)

The quantum device according to Supplementary Note 5, wherein the shield part includes a wave-shaped side part provided along an outer periphery of the quantum chip.

(Supplementary Note 7)

The quantum device according to Supplementary Note 5 or 6, wherein the shield part includes a corner part having a round shape or a chamfered shape, or having a width larger than that of a side part provided along an outer periphery of the quantum chip.

(Supplementary Note 8)

The quantum device according to any one of Supplementary Notes 1 to 7, wherein the shield part is provided so as to seal the quantum circuit region.

(Supplementary Note 9)

The quantum device according to Supplementary Note 8, further comprising:

a sample table including a recessed part in which the quantum chip is arranged; and an adhesive provided in a space region between the recessed part of the sample table and the quantum chip.

(Supplementary Note 10)

A method of manufacturing a quantum device, the method comprising:

providing a shield part so as to surround a quantum circuit region of an interposer and a quantum chip; and arranging a quantum chip on the interposer via the shield part.

What is claimed is:

1. A quantum device comprising:
an interposer;
a quantum chip mounted on the interposer;
a shield part provided between the interposer and the quantum chip so that the shield part is connected to the interposer and the quantum chip and so as to surround a quantum circuit region of the interposer and the quantum chip;
a sample table including a recessed part in which the quantum chip is arranged; and
an adhesive provided in a space region between the recessed part of the sample table and the quantum chip, wherein the shield part is provided so as to seal the quantum circuit region.

2. The quantum device according to claim 1, further comprising a connection part that is provided in the quantum circuit region and electrically connects the interposer to the quantum chip.

3. The quantum device according to claim 2, wherein the shield part and the connection part are at least partially formed of a superconducting material.

4. The quantum device according to claim 1, wherein the shield part is connected to ground.

5. The quantum device according to claim 1, wherein the shield part is provided along an outer periphery of the quantum chip.

6. The quantum device according to claim 5, wherein the shield part includes a wave-shaped side part provided along the outer periphery of the quantum chip.

7. The quantum device according to claim 5, wherein the shield part includes a corner part having a round shape or a chamfered shape, or having a width larger than that of a side part provided along the outer periphery of the quantum chip.

8. A quantum device comprising:
an interposer;
a quantum chip mounted on the interposer; and
a shield part provided between the interposer and the quantum chip so that the shield part is connected to the interposer and the quantum chip and so as to surround a quantum circuit region of the interposer and the quantum chip, wherein
the shield part is provided along an outer periphery of the quantum chip, and
the shield part includes a wave-shaped side part provided along the outer periphery of the quantum chip.

9. The quantum device according to claim 8, further comprising a connection part that is provided in the quantum circuit region and that electrically connects the interposer to the quantum chip.

10. The quantum device according to claim 9, wherein the shield part and the connection part are at least partially formed of a superconducting material.

11. The quantum device according to claim 8, wherein the shield part is connected to ground.

12. A quantum device comprising:
an interposer;
a quantum chip mounted on the interposer; and
a shield part provided between the interposer and the quantum chip so that the shield part is connected to the interposer and the quantum chip and so as to surround a quantum circuit region of the interposer and the quantum chip, wherein
the shield part is provided along an outer periphery of the quantum chip, and
the shield part includes a corner part having a round shape or a chamfered shape, or having a width larger than that of a side part provided along the outer periphery of the quantum chip.

13. The quantum device according to claim 12, further comprising a connection part that is provided in the quantum circuit region and that electrically connects the interposer to the quantum chip.

14. The quantum device according to claim 13, wherein the shield part and the connection part are at least partially formed of a superconducting material.

15. The quantum device according to claim 12, wherein the shield part is connected to ground.

* * * * *